(12) United States Patent
Musyimi

(10) Patent No.: US 11,767,494 B2
(45) Date of Patent: Sep. 26, 2023

(54) BINARY AZEOTROPE AND AZEOTROPE-LIKE COMPOSITIONS COMPRISING PERFLUOROHEPTENE

(71) Applicant: THE CHEMOURS COMPANY FC, LLC, Wilmington, DE (US)

(72) Inventor: Harrison K. Musyimi, Bear, DE (US)

(73) Assignee: THE CHEMOURS COMPANY FC, LLC, Wilmington, DE (US)

( * ) Notice: Subject to any disclaimer, the term of this patent is extended or adjusted under 35 U.S.C. 154(b) by 587 days.

(21) Appl. No.: 17/051,811

(22) PCT Filed: May 1, 2019

(86) PCT No.: PCT/US2019/030106
§ 371 (c)(1),
(2) Date: Oct. 30, 2020

(87) PCT Pub. No.: WO2019/213193
PCT Pub. Date: Nov. 7, 2019

(65) Prior Publication Data
US 2021/0139819 A1    May 13, 2021

Related U.S. Application Data

(60) Provisional application No. 62/742,013, filed on Oct. 5, 2018, provisional application No. 62/666,454, filed on May 3, 2018.

(51) Int. Cl.
*C11D 3/43* (2006.01)
*C11D 7/50* (2006.01)
*C11D 11/00* (2006.01)
*G11B 5/725* (2006.01)

(52) U.S. Cl.
CPC ............ *C11D 7/5072* (2013.01); *C11D 7/509* (2013.01); *C11D 7/5095* (2013.01); *C11D 11/0023* (2013.01); *G11B 5/7253* (2020.08)

(58) Field of Classification Search
None
See application file for complete search history.

(56) References Cited

U.S. PATENT DOCUMENTS

| 3,449,218 | A | * | 6/1969 | Horst | ................ | C07C 17/386 |
|---|---|---|---|---|---|---|
| | | | | | | 203/61 |
| 5,171,902 | A | | 12/1992 | Krespan | | |
| 2008/0295580 | A1 | | 12/2008 | Minor | | |
| 2012/0010119 | A1 | * | 1/2012 | Cunningham | ......... | C11D 3/162 |
| | | | | | | 427/372.2 |

FOREIGN PATENT DOCUMENTS

| EP | 3216840 A1 | 9/2017 |
|---|---|---|
| WO | 2007053697 A2 | 5/2007 |
| WO | 2017/105962 A1 | 6/2017 |
| WO | 2017105962 A1 | 6/2017 |

* cited by examiner

*Primary Examiner* — Charles I Boyer

(57) ABSTRACT

The present application provides binary azeotrope or azeotrope-like compositions comprising perfluoroheptene and an additional component, wherein the additional component is present in the composition in an amount effective to form an azeotrope composition or azeotrope-like composition with the perfluoroheptene. Methods of using the compositions provided herein in cleaning and carrier fluid applications are also provided.

20 Claims, No Drawings

__US 11,767,494 B2__

BINARY AZEOTROPE AND AZEOTROPE-LIKE COMPOSITIONS COMPRISING PERFLUOROHEPTENE

CROSS REFERENCE TO RELATED APPLICATIONS

This application is a national filing under 35 U.S. C. 371 of International Application No. PCT/US2019/030106 filed May 1, 2019, which claims priority of U.S. Provisional Application No. 62/742,013 filed Oct. 5, 2018, and claims priority of U.S. Provisional Application No. 62/666,454 filed May 3, 2018 the disclosures of which are incorporated herein by reference in its entirety.

TECHNICAL FIELD

This invention relates to binary azeotrope or azeotrope-like compositions comprising perfluoroheptene and an additional component, wherein the additional component is present in the composition in an amount effective to form an azeotrope composition or azeotrope-like composition with the perfluoroheptene. The compositions described herein may be useful, for example, in cleaning and carrier fluid applications.

BACKGROUND

Chlorofluorocarbon (CFC) compounds have been used extensively in the area of semiconductor manufacture to clean surfaces such as magnetic disk media. However, chlorine-containing compounds such as CFC compounds are considered to be detrimental to the Earth's ozone layer. In addition, many of the hydrofluorocarbons used to replace CFC compounds have been found to contribute to global warming. Therefore, there is a need to identify new environmentally safe solvents for cleaning applications, such as removing residual flux, lubricant or oil contaminants, and particles. There is also a need for identification of new solvents for deposition of fluorolubricants and for drying or dewatering of substrates that have been processed in aqueous solutions.

SUMMARY

The present application provides, inter alia, a composition comprising:
 i) perfluoroheptene; and
 ii) a compound selected from methyl acetate, acetone, tert-butyl acetate, isopropyl acetate, n-heptane, iso-octane, n-hexane, hexamethyldisiloxane, and cyclopentane;
 wherein the methyl acetate, acetone, tert-butyl acetate, isopropyl acetate, n-heptane, iso-octane, n-hexane, hexamethyldisiloxane, or cyclopentane is present in the composition in an amount effective to form an azeotrope composition or azeotrope-like composition with the perfluoroheptene.

The present application further provides processes for dissolving a solute, comprising contacting and mixing said solute with a sufficient quantity of the composition described herein.

The present application further provides a processes of cleaning a surface, comprising contacting a composition described herein with said surface.

The present application further provides a process for removing at least a portion of water from the surface of a wetted substrate, comprising contacting the substrate with the composition described herein, and then removing the substrate from contact with the composition.

Unless otherwise defined, all technical and scientific terms used herein have the same meaning as commonly understood by one of ordinary skill in the art to which this invention belongs. Methods and materials are described herein for use in the present invention; other, suitable methods and materials known in the art can also be used. The materials, methods, and examples are illustrative only and not intended to be limiting. All publications, patent applications, patents, sequences, database entries, and other references mentioned herein are incorporated by reference in their entirety. In case of conflict, the present specification, including definitions, will control.

DETAILED DESCRIPTION

The present disclosure provides new binary azeotropic and azeotrope-like compositions comprising hydrofluorocarbon mixtures. These compositions have utility in many of the applications formerly served by CFC compounds. The compositions of the present disclosure possess some or all of the desired properties of little or no environmental impact and the ability to dissolve oils, greases, and/or fluxes.

Definitions and Abbreviations

As used herein, the terms "comprises," "comprising," "includes," "including," "has," "having" or any other variation thereof, are intended to cover a non-exclusive inclusion. For example, a process, method, article, or apparatus that comprises a list of elements is not necessarily limited to only those elements but may include other elements not expressly listed or inherent to such process, method, article, or apparatus. Further, unless expressly stated to the contrary, "or" refers to an inclusive or and not to an exclusive or. For example, a condition A or B is satisfied by any one of the following: A is true (or present) and B is false (or not present), A is false (or not present) and B is true (or present), and both A and B are true (or present).

As used herein, the term "consisting essentially of" is used to define a composition, method that includes materials, steps, features, components, or elements, in addition to those literally disclosed provided that these additional included materials, steps, features, components, or elements do not materially affect the basic and novel characteristic(s) of the claimed invention, especially the mode of action to achieve the desired result of any of the processes of the present invention. The term "consists essentially of" or "consisting essentially of" occupies a middle ground between "comprising" and "consisting of".

Also, use of "a" or "an" are employed to describe elements and components described herein. This is done merely for convenience and to give a general sense of the scope of the invention. This description should be read to include one or at least one and the singular also includes the plural unless it is obvious that it is meant otherwise.

As used herein, the term "about" is meant to account for variations due to experimental error (e.g., plus or minus approximately 10% of the indicated value). All measurements reported herein are understood to be modified by the term "about", whether or not the term is explicitly used, unless explicitly stated otherwise.

When an amount, concentration, or other value or parameter is given as either a range, preferred range or a list of upper preferable values and/or lower preferable values, this is to be understood as specifically disclosing all ranges formed from any pair of any upper range limit or preferred value and any lower range limit or preferred value, regardless of whether ranges are separately disclosed. Where a range of numerical values is recited herein, unless otherwise stated, the range is intended to include the endpoints thereof, and all integers and fractions within the range.

As recognized in the art, an azeotropic composition is an admixture of two or more different components which, when in liquid form and (1a) under a given constant pressure, will boil at a substantially constant temperature, which temperature may be higher or lower than the boiling temperatures of the individual components, or (1b) at a given constant temperature, will boil at a substantially constant pressure, which pressure may be higher or lower than the boiling pressure of the individual components, and (2) will boil at substantially constant composition, which phase compositions, while constant, are not necessarily equal (see, e.g., M. F. Doherty and M. F. Malone, Conceptual Design of Distillation Systems, McGraw-Hill (New York), 2001, 185).

A homogeneous azeotrope, in which a single vapor phase is in equilibrium with a single liquid phase, has, in addition to properties (1a), (1b), and (2) above, the composition of each component is the same in each of the coexisting equilibrium phases. The general term "azeotrope" is a commonly used alternative name for a homogeneous azeotrope.

As used herein, an "azeotrope-like" composition refers to a composition that behaves like an azeotropic composition (i.e., has constant boiling characteristics or a tendency not to fractionate upon boiling or evaporation). Hence, during boiling or evaporation, the vapor and liquid compositions, if they change at all, change only to a minimal or negligible extent. In contrast, the vapor and liquid compositions of non-azeotrope-like compositions change to a substantial degree during boiling or evaporation.

As used herein, the terms "azeotrope-like" or "azeotrope-like behavior" refer to compositions that exhibit dew point pressure and bubble point pressure with virtually no pressure differential. In some embodiments, the difference in the dew point pressure and bubble point pressure at a given temperature is 3% or less. In some embodiments, the difference in the bubble point and dew point pressures is 5% or less.

Azeotrope and Azeotrope-Like Compositions

A composition, comprising:
i) perfluoroheptene; and
ii) a compound selected from methyl acetate, acetone, tert-butyl acetate, isopropyl acetate, n-heptane, iso-octane, n-hexane, hexamethyldisiloxane, and cyclopentane;
wherein the methyl acetate, acetone, tert-butyl acetate, isopropyl acetate, n-heptane, iso-octane, n-hexane, hexamethyldisiloxane, or cyclopentane is present in the composition in an amount effective to form an azeotrope composition or azeotrope-like composition with the perfluoroheptene.

In some embodiments, the perfluoroheptene comprises a mixture of perfluorohept-3-ene and perfluorohept-2-ene.

In some embodiments, the perfluoroheptene comprises about 85 to about 95 weight percent perfluorohept-3-ene and about 5 to about 15 weight percent perfluorohept-2-ene.

In some embodiments, the perfluoroheptene comprises about 90 weight percent perfluorohept-3-ene and about 10 weight percent perfluorohept-2-ene.

In some embodiments, the composition comprises perfluoroheptene and methyl acetate, wherein the methyl acetate is present in the composition in an amount effective to form an azeotrope composition or azeotrope-like composition with the perfluoroheptene.

In some embodiments, the composition comprises about 0.1 to about 60 weight percent perfluoroheptene, for example, about 0.1 to about 50, about 0.1 to about 35, about 0.1 to about 20, about 0.1 to about 10, about 10 to about 60, about 10 to about 50, about 10 to about 35, about 10 to about 20, about 20 to about 60, about 20 to about 50, about 20 to about 35, about 35 to about 60, about 35 to about 50, or about 50 to about 60 weight percent perfluoroheptene.

In some embodiments, the composition comprises about 99.9 to about 40 weight percent methyl acetate, for example, about 99.9 to about 50, about 99.9 to about 65, about 99.9 to about 80, about 99.9 to about 90, about 90 to about 40, about 90 to about 50, about 90 to about 65, about 90 to about 80, about 80 to about 40, about 80 to about 50, about 80 to about 65, about 65 to about 40, about 65 to about 50, or about 50 to about 40 weight percent methyl acetate.

In some embodiments, the composition consists essentially of perfluoroheptene and methyl acetate.

In some embodiments, the composition consists essentially of from about 0.1 to about 60 weight percent perfluoroheptene, as described above, and from about 99.9 to about 40 weight percent methyl acetate, as described above.

In some embodiments, the composition consists essentially of about 29 to about 31 weight percent perfluoroheptene and about 69 to about 71 weight percent methyl acetate.

In some embodiments, the composition consists essentially of about 30 weight percent perfluoroheptene and about 70 weight percent methyl acetate.

In some embodiments, the composition comprising, consisting essentially of, or consisting of perfluoroheptene and methyl acetate is an azeotrope composition.

In some embodiments, the composition comprising, consisting essentially of, or consisting of perfluoroheptene and methyl acetate is an azeotrope-like composition.

In some embodiments, the composition comprising, consisting essentially of, or consisting of perfluoroheptene and methyl acetate has a boiling point of about 47° C. to about 48° C. at a pressure of about 101 kPa.

In some embodiments, the composition comprises perfluoroheptene and acetone, wherein the acetone is present in the composition in an amount effective to form an azeotrope composition or azeotrope-like composition with the perfluoroheptene.

In some embodiments, the composition comprises about 0.1 to about 30 weight percent perfluoroheptene, for example, about 0.1 to about 25, about 0.1 to about 15, about 0.1 to about 10, about 0.1 to about 5, about 5 to about 30, about 5 to about 25, about 5 to about 15, about 5 to about 10, about 10 to about 30, about 10 to about 25, about 10 to about 15, about 15 to about 30, about 15 to about 25, or about 25 to about 30 weight percent perfluoroheptene.

In some embodiments, the composition comprises about 99.9 to about 70 weight percent acetone, for example, about 99.9 to about 75, about 99.9 to about 85, about 99.9 to about 90, about 99.9 to about 95, about 95 to about 70, about 95 to about 75, about 95 to about 85, about 95 to about 90, about 90 to about 70, about 90 to about 75, about 90 to about 85, about 85 to about 70, about 85 to about 75, or about 75 to about 70 weight percent acetone.

In some embodiments, the composition consists essentially of perfluoroheptene and acetone.

In some embodiments, the composition consists essentially of from about 0.1 to about 30 weight percent perfluoroheptene, as described above, and from about 99.9 to about 60 weight percent acetone, as described above.

In some embodiments, the composition consists essentially of about 29 to about 31 weight percent perfluoroheptene and about 69 to about 71 weight percent methyl acetate.

In some embodiments, the composition consists essentially of about 30 weight percent perfluoroheptene and about 70 weight percent methyl acetate.

In some embodiments, the composition comprising, consisting essentially of, or consisting of perfluoroheptene and acetone is an azeotrope composition.

In some embodiments, the composition comprising, consisting essentially of, or consisting of perfluoroheptene and acetone is an azeotrope-like composition.

In some embodiments, the composition comprising, consisting essentially of, or consisting of perfluoroheptene and acetone has a boiling point of about 44° C. to about 45° C. at a pressure of about 101 kPa.

In some embodiments, the composition comprises perfluoroheptene and tert-butyl acetate, wherein the tert-butyl acetate is present in the composition in an amount effective to form an azeotrope composition or azeotrope-like composition with the perfluoroheptene.

In some embodiments, the composition comprises about 87 to about 94 weight percent perfluoroheptene, for example, about 87 to about 92, about 87 to about 90, about 87 to about 89, about 89 to about 94, about 89 to about 92, about 89 to about 90, about 90 to about 94, about 90 to about 92, or about 92 to about 94 weight percent perfluoroheptene.

In some embodiments, the composition comprises about 6 to about 13 weight percent tert-butyl acetate, for example, about 6 to about 11, about 6 to about 10, about 6 to about 8, about 8 to about 13, about 8 to about 11, about 8 to about 10, about 10 to about 13, about 10 to about 11, or about 11 to about 13 weight percent tert-butyl acetate.

In some embodiments, the composition consists essentially of perfluoroheptene and tert-butyl acetate.

In some embodiments, the composition consists essentially of from about 87 to about 94 weight percent perfluoroheptene, as described above, and from about 6 to about 13 weight percent tert-butyl acetate, as described above.

In some embodiments, the composition consists essentially of about 89 to about 91 weight percent perfluoroheptene and about 9 to about 11 weight percent tert-butyl acetate.

In some embodiments, the composition consists essentially of about 90 weight percent perfluoroheptene and about 10 weight percent tert-butyl acetate.

In some embodiments, the composition comprising, consisting essentially of, or consisting of perfluoroheptene and tert-butyl acetate is an azeotrope composition.

In some embodiments, the composition comprising, consisting essentially of, or consisting of perfluoroheptene and tert-butyl acetate is an azeotrope-like composition.

In some embodiments, the composition comprising, consisting essentially of, or consisting of perfluoroheptene and tert-butyl acetate has a boiling point of about 68° C. to about 70° C. at a pressure of about 101 kPa.

In some embodiments, the composition comprising, consisting essentially of, or consisting of perfluoroheptene and tert-butyl acetate has a boiling point of about 69° C. at a pressure of about 101 kPa.

In some embodiments, the composition comprises perfluoroheptene and isopropyl acetate, wherein the isopropyl acetate is present in the composition in an amount effective to form an azeotrope composition or azeotrope-like composition with the perfluoroheptene.

In some embodiments, the composition comprises about 70 to about 90 weight percent perfluoroheptene, for example, about 70 to about 85, about 70 to about 80, about 70 to about 75, about 75 to about 90, about 75 to about 85, about 75 to about 80, about 80 to about 90, about 80 to about 85, or about 85 to about 90 weight percent perfluoroheptene.

In some embodiments, the composition comprises about 10 to about 30 weight percent isopropyl acetate, for example, about 10 to about 25, about 10 to about 20, about 10 to about 15, about 15 to about 30, about 15 to about 25, about 15 to about 20, about 20 to about 30, about 20 to about 25, or about 25 to about 30 weight percent isopropyl acetate.

In some embodiments, the composition consists essentially of perfluoroheptene and isopropyl acetate.

In some embodiments, the composition consists essentially of from about 70 to about 90 weight percent perfluoroheptene, as described above, and from about 10 to about 30 weight percent isopropyl acetate, as described above.

In some embodiments, the composition consists essentially of about 84 to about 86 weight percent perfluoroheptene and about 14 to about 16 weight percent isopropyl acetate.

In some embodiments, the composition consists essentially of about 85 weight percent perfluoroheptene and about 15 weight percent isopropyl acetate.

In some embodiments, the composition comprising, consisting essentially of, or consisting of perfluoroheptene and isopropyl acetate is an azeotrope composition.

In some embodiments, the composition comprising, consisting essentially of, or consisting of perfluoroheptene and isopropyl acetate is an azeotrope-like composition.

In some embodiments, the composition comprising, consisting essentially of, or consisting of perfluoroheptene and isopropyl acetate has a boiling point of about 64° C. to about 66° C. at a pressure of about 101 kPa.

In some embodiments, the composition comprising, consisting essentially of, or consisting of perfluoroheptene and isopropyl acetate has a boiling point of about 65° C. at a pressure of about 101 kPa.

In some embodiments, the composition comprises perfluoroheptene and n-heptane, wherein the n-heptane is present in the composition in an amount effective to form an azeotrope composition or azeotrope-like composition with the perfluoroheptene.

In some embodiments, the composition comprises about 85 to about 95 weight percent perfluoroheptene, for example, about 85 to about 90 or about 90 to about 95 weight percent perfluoroheptene.

In some embodiments, the composition comprises about 5 to about 15 weight percent n-heptane, for example, about 5 to about 10 or about 10 to about 15 weight percent n-heptane.

In some embodiments, the composition consists essentially of perfluoroheptene and n-heptane.

In some embodiments, the composition consists essentially of from about 85 to about 95 weight percent perfluoroheptene, as described above, and from about 5 to about 15 weight percent n-heptane, as described above.

In some embodiments, the composition consists essentially of about 89 to about 91 weight percent perfluoroheptene and about 9 to about 11 weight percent n-heptane.

In some embodiments, the composition consists essentially of about 90 weight percent perfluoroheptene and about 10 weight percent n-heptane.

In some embodiments, the composition comprising, consisting essentially of, or consisting of perfluoroheptene and n-heptane is an azeotrope composition.

In some embodiments, the composition comprising, consisting essentially of, or consisting of perfluoroheptene and n-heptane is an azeotrope-like composition.

In some embodiments, the composition comprising, consisting essentially of, or consisting of perfluoroheptene and n-heptane has a boiling point of about 66° C. to about 67° C. at a pressure of about 101 kPa.

In some embodiments, the composition comprises perfluoroheptene and iso-octane, wherein the iso-octane is present in the composition in an amount effective to form an azeotrope composition or azeotrope-like composition with the perfluoroheptene.

In some embodiments, the composition comprises about 85 to about 99.9 weight percent perfluoroheptene, for example, about 85 to about 95, about 85 to about 90, about 90 to about 99.9, about 90 to about 95, or about 95 to about 99.9 weight percent perfluoroheptene.

In some embodiments, the composition comprises about 0.1 to about 15 weight percent iso-octane, for example, about 0.1 to about 10, about 0.1 to about 5, about 5 to about 15, about 5 to about 10, or about 10 to about 15 weight percent iso-octane.

In some embodiments, the composition consists essentially of perfluoroheptene and iso-octane.

In some embodiments, the composition consists essentially of from about 85 to about 99.9 weight percent perfluoroheptene, as described above, and from about 0.1 to about 15 weight percent iso-octane, as described above.

In some embodiments, the composition consists essentially of about 90 to about 92 weight percent perfluoroheptene and about 8 to about 10 weight percent iso-octane.

In some embodiments, the composition consists essentially of about 91 weight percent perfluoroheptene and about 9 weight percent iso-octane.

In some embodiments, the composition comprising, consisting essentially of, or consisting of perfluoroheptene and iso-octane is an azeotrope composition.

In some embodiments, the composition comprising, consisting essentially of, or consisting of perfluoroheptene and iso-octane is an azeotrope-like composition.

In some embodiments, the composition comprising, consisting essentially of, or consisting of perfluoroheptene and iso-octane has a boiling point of about 67° C. to about 68° C. at a pressure of about 101 kPa.

In some embodiments, the composition comprises perfluoroheptene and n-hexane, wherein the n-hexane is present in the composition in an amount effective to form an azeotrope composition or azeotrope-like composition with the perfluoroheptene.

In some embodiments, the composition comprises about 60 to about 80 weight percent perfluoroheptene, for example, about 60 to about 75, about 60 to about 70, about 60 to about 65, about 65 to about 80, about 65 to about 75, about 65 to about 70, about 70 to about 80, about 70 to about 75, about 75 to about 80 weight percent perfluoroheptene.

In some embodiments, the composition comprises about 20 to about 40 weight percent n-hexane, for example, about 20 to about 35, about 20 to about 30, about 20 to about 25, about 25 to about 40, about 25 to about 35, about 25 to about 30, about 30 to about 40, about 30 to about 35, or about 35 to about 40 weight percent n-hexane.

In some embodiments, the composition consists essentially of perfluoroheptene and n-hexane.

In some embodiments, the composition consists essentially of from about 60 to about 80 weight percent perfluoroheptene, as described above, and from about 20 to about 40 weight percent n-hexane, as described above.

In some embodiments, the composition consists essentially of about 90 to about 92 weight percent perfluoroheptene and about 8 to about 10 weight percent n-hexane.

In some embodiments, the composition consists essentially of about 91 weight percent perfluoroheptene and about 9 weight percent n-hexane.

In some embodiments, the composition comprising, consisting essentially of, or consisting of perfluoroheptene and n-hexane is an azeotrope composition.

In some embodiments, the composition comprising, consisting essentially of, or consisting of perfluoroheptene and n-hexane is an azeotrope-like composition.

In some embodiments, the composition comprising, consisting essentially of, or consisting of perfluoroheptene and n-hexane has a boiling point of about 55° C. to about 56° C. at a pressure of about 101 kPa.

In some embodiments, the composition comprises perfluoroheptene and hexamethyldisiloxane, wherein the hexamethyldisiloxane is present in the composition in an amount effective to form an azeotrope composition or azeotrope-like composition with the perfluoroheptene.

In some embodiments, the composition comprises about 99.9 to about 90 weight percent perfluoroheptene, for example, about 99.9 to about 92, about 99.9 to about 94, about 99.9 to about 96, about 99.9 to about 98, about 98 to about 90, about 98 to about 92, about 98 to about 94, about 98 to about 96, about 96 to about 90, about 96 to about 92, about 96 to about 94, about 94 to about 90, about 94 to about 92, about 92 to about 90 weight percent perfluoroheptene.

In some embodiments, the composition comprises about 0.1 to about 10 weight percent hexamethyldisiloxane, for example, about 0.1 to about 8, about 0.1 to about 6, about 0.1 to about 4, about 0.1 to about 2, about 2 to about 10, about 2 to about 8, about 2 to about 6, about 2 to about 4, about 4 to about 10, about 4 to about 8, about 4 to about 6, about 6 to about 10, about 6 to about 8, about 8 to about 10 weight percent hexamethyldisiloxane.

In some embodiments, the composition consists essentially of perfluoroheptene and hexamethyldisiloxane.

In some embodiments, the composition consists essentially of from about 99.9 to about 90 weight percent perfluoroheptene, as described above, and from about 0.1 to about 10 weight percent hexamethyldisiloxane, as described above.

In some embodiments, the composition consists essentially of about 90 to about 92 weight percent perfluoroheptene and about 8 to about 10 weight percent hexamethyldisiloxane.

In some embodiments, the composition consists essentially of about 91 weight percent perfluoroheptene and about 9 weight percent hexamethyldisiloxane.

In some embodiments, the composition comprising, consisting essentially of, or consisting of perfluoroheptene and hexamethyldisiloxane is an azeotrope composition.

In some embodiments, the composition comprising, consisting essentially of, or consisting of perfluoroheptene and hexamethyldisiloxane is an azeotrope-like composition.

In some embodiments, the composition has a boiling point of about 66° C. to about 67° C. at a pressure of about 101 kPa.

In some embodiments, the composition comprises perfluoroheptene and cyclopentane, wherein the cyclopentane is present in the composition in an amount effective to form an azeotrope composition or azeotrope-like composition with the perfluoroheptene.

In some embodiments, the composition comprises about 99.9 to about 50 weight percent perfluoroheptene, for example, about 99.9 to about 60, about 99.9 to about 70, about 99.9 to about 80, about 99.9 to about 90, about 99.9 to about 95, about 95 to about 50, about 95 to about 60, about 95 to about 70, about 95 to about 80, about 95 to about 90, about 90 to about 50, about 90 to about 60, about 90 to about 70, about 90 to about 80, about 80 to about 50, about 80 to about 60, about 80 to about 70, about 70 to about 50, about 70 to about 60, or about 60 to about 50 weight percent perfluoroheptene.

In some embodiments, the composition comprises about 0.1 to about 50 weight percent cyclopentane, for example, about 0.1 to about 40, about 0.1 to about 30, about 0.1 to about 20, about 0.1 to about 10, about 0.1 to about 5, about 5 to about 50, about 5 to about 40, about 5 to about 30, about 5 to about 20, about 5 to about 10, about 10 to about 50, about 10 to about 40, about 10 to about 30, about 10 to about 20, about 20 to about 50, about 20 to about 40, about 20 to about 30, about 30 to about 50, about 30 to about 40, or about 40 to about 50 weight percent cyclopentane.

In some embodiments, the composition consists essentially of perfluoroheptene and cyclopentane.

In some embodiments, the composition consists essentially of from about 99.9 to about 50 weight percent perfluoroheptene, as described above, and from about 0.1 to about 50 weight percent cyclopentane, as described above.

In some embodiments, composition consists essentially of about 58 to about 65 weight percent perfluoroheptene and about 35 to about 42 weight percent cyclopentane.

In some embodiments, composition consists essentially of about 60 to about 63 weight percent perfluoroheptene and about 37 to about 40 weight percent cyclopentane.

In some embodiments, the composition comprising, consisting essentially of, or consisting of perfluoroheptene and cyclopentane is an azeotrope composition.

In some embodiments, the composition comprising, consisting essentially of, or consisting of perfluoroheptene and cyclopentane is an azeotrope-like composition.

In some embodiments, the composition comprising, consisting essentially of, or consisting of perfluoroheptene and cyclopentane the composition has a boiling point of about 41° C. to about 42° C. at a pressure of about 101 kPa.

Methods of Use

In some embodiments, compositions described herein are useful as cleaning agents, defluxing agents, and/or degreasing agents. Accordingly, the present application provides a process of cleaning a surface, comprising contacting a composition provided herein with said surface. In some embodiments, the process comprises removing a residue from a surface or substrate, comprising contacting the surface or substrate with a composition provided herein and recovering the surface or substrate from the composition.

In some embodiments, the present application further provides a process for dissolving a solute, comprising contacting and mixing said solute with a sufficient quantity of a composition provided herein.

In some embodiments, the surface or substrate may be an integrated circuit device, in which case, the residue comprises rosin flux or oil. The integrated circuit device may be a circuit board with various types of components, such as Flip chips, µBGAs, or Chip scale packaging components. The surface or substrate may additionally be a metal surface such as stainless steel. The rosin flux may be any type commonly used in the soldering of integrated circuit devices, including but not limited to RMA (rosin mildly activated), RA (rosin activated), WS (water soluble), and OA (organic acid). Oil residues include but are not limited to mineral oils, motor oils, and silicone oils.

In some embodiments, the present application provides a process for removing at least a portion of water from the surface of a wetted substrate, or surface, or device, comprising contacting the substrate, surface, or device with a composition provided herein, and then removing the substrate, surface, or device from contact with the composition.

In some embodiments, the composition provided herein further comprises at least one surfactant suitable for dewatering or drying the substrate. Exemplary surfactants include, but are not limited to, alkyl dimethyl ammonium isooctyl phosphates, tert-alkyl amines (e.g., tert-butyl amine), perfluoro alkyl phosphates, dimethyl decenamide, fluorinated alkyl polyether, quaternary amines (e.g., ammonium salts), and glycerol monostearate.

The means for contacting a device, surface, or substrate is not critical and may be accomplished, for example, by immersion of the device, surface, or substrate, in a bath containing the composition provided herein, spraying the device, surface, or substrate with the composition provided herein, or wiping the device, surface, or substrate with a material (e.g., a cloth) that has been wet with the composition. Alternatively, a composition provided herein may also be used in a vapor degreasing or defluxing apparatus designed for such residue removal. Such vapor degreasing or defluxing equipment is available from various suppliers such as Forward Technology (a subsidiary of the Crest Group, Trenton, NJ), Trek Industries (Azusa, CA), and Ultronix, Inc. (Hatfield, PA) among others.

The most advanced, highest recording densities and lowest cost method of storing digital information involves writing and reading magnetic flux patterns from rotating disks coated with magnetic materials. A magnetic layer, where information is stored in the form of bits, is sputtered onto a metallic support structure. Next an overcoat, usually a carbon-based material, is placed on top of the magnetic layer for protection and finally a lubricant is applied to the overcoat. A read-write head flies above the lubricant and the information is exchanged between the head and the magnetic layer. In a relentless attempt to increase the efficiency of information transfer, hard drive manufacturers have reduced the distance between the head and the magnetic layer, or fly-height, to less than 100 Angstroms.

Invariably, during normal disk drive application, the head and the disk surface will make contact. To reduce wear on the disk, from both sliding and flying contacts, it must be lubricated.

Fluorolubricants are widely used as lubricants in the magnetic disk drive industry to decrease the friction between the head and disk, that is, reduce the wear and therefore minimize the possibility of disk failure.

There is a need in the industry for improved methods for deposition of fluorolubricants. The use of certain solvents, such as CFC-113 and PFC-5060, has been regulated due to their impact on the environment. Therefore, solvents that will be used in this application should consider environmental impact. Also, such solvent must dissolve the fluorolubricant and form a substantially uniform or uniform coating of fluorolubricant. Additionally, existing solvents have been found to require higher fluorolubricant concentrations to produce a given thickness coating and produce irregularities in uniformity of the fluorolubricant coating.

In some embodiments, the fluorolubricants of the present disclosure comprise perfluoropolyether (PFPE) compounds, or lubricant comprising X-1P®, which is a phosphazene-containing disk lubricant. These perfluoroether compounds are sometimes referred to as perfluoroalkylethers (PFAE) or perfluoropolyalkylethers (PFPAE). These PFPE compounds range from simple perfluorinated ether polymers to functionalized perfluorinated ether polymers. PFPE compounds of different varieties that may be useful as fluorolubricant in the present invention are available from several sources. In some embodiments, fluorolubricants useful in the processes provided herein include, but are not limited to, Krytox® GLP 100, GLP 105 or GLP 160 (The Chemours Co., LLC, Fluoroproducts, Wilmington, DE, 19898, USA); Fomblin® Z-Dol 2000, 2500 or 4000, Z-Tetraol, or Fomblin® AM 2001 or AM 3001 (sold by Solvay Solexis S.p.A., Milan, Italy); Demnum™ LR-200 or S-65 (offered by Daikin America, Inc., Osaka, Japan); X-1P® (a partially fluorinated hyxaphenoxy cyclotriphosphazene disk lubricant available from Quixtor Technologies Corporation, a subsidiary of Dow Chemical Co, Midland, MI); and mixtures thereof. The Krytox® lubricants are perfluoroalkylpolyethers having the general structure $F(CF(CF_3)CF_2O)_n$—$CF_2CF_3$, wherein n ranges from 10 to 60. The Fomblin® lubricants are functionalized perfluoropolyethers that range in molecular weight from 500 to 4000 atomic mass units and have general formula X—$CF_2$—$O(CF_2$—$CF_2$—$O)_p$—$(CF_2O)_q$—$CF_2$—X, wherein X may be —$CH_2OH$, p+q is 40 to 180, and p/q is 0.5 to 2; $CH_2(O$—$CH_2$—$CH_2)_nOH$, wherein n is 10 to 60, $CH_2OCH_2CH(OH)CH_2OH$, or —$CH_2O$—$CH_2$-piperonyl. The Demnum™ oils are perfluoropolyether-based oils ranging in molecular weight from 2700 to 8400 atomic mass units. Additionally, new lubricants are being developed such as those from Moresco (Thailand) Co., Ltd, which may be useful in processes provided herein.

The fluorolubricants described herein may additionally comprise additives to improve the properties of the fluorolubricant. X-1P®, which may serve as the lubricant itself, is often added to other lower cost fluorolubricants in order to increase the durability of disk drives by passivating Lewis acid sites on the disk surface responsible for PFPE degradation. Other common lubricant additives may be used in the fluorolubricants useful in the processes provided herein.

The fluorolubricants described herein may further comprise Z-DPA (Hitachi Global Storage Technologies, San Jose, CA), a PFPE terminated with dialkylamine endgroups. The nucleophilic end-groups serve the same purpose as X1P®, thus providing the same stability without any additive.

The surface on which the fluorolubricant may be deposited is any solid surface that may benefit from lubrication. Semiconductor materials such as silica disks, metal or metal oxide surfaces, vapor deposited carbon surfaces or glass surfaces are representative of the types of surfaces that may be used in the processes described herein. In some embodiments, the processes provided herein are particularly useful in coating magnetic media such as computer drive hard disks. In the manufacture of computer disks, the surface may be a glass, or aluminum substrate with layers of magnetic media that is also coated by vapor deposition with a thin (10-50 Angstrom) layer of amorphous hydrogenated or nitrogenated carbon. The fluorolubricant may be deposited on the surface disk indirectly by applying the fluorolubricant to the carbon layer of the disk.

The first step of combining the fluorolubricant and composition provided herein (i.e., as a solvent) may be accomplished in any suitable manner such as mixing in a suitable container such as a beaker or other container that may be used as a bath for the deposition process. The fluorolubricant concentration in the composition provided herein may be from about 0.010 percent (wt/wt) to about 0.50 percent (wt/wt).

The step of contacting said combination of fluorolubricant and composition provided herein with the surface may be accomplished in any manner appropriate for said surface (considering the size and shape of the surface). A hard drive disk must be supported in some manner such as with a mandrel or some other support that may fit through the hole in the center of the disk. The disk will thus be held vertically such that the plane of the disk is perpendicular to the solvent bath. The mandrel may have different shapes including but not limited to, a cylindrical bar, or a V-shaped bar. The mandrel shape will determine the area of contact with the disk. The mandrel may be constructed of any material strong enough to hold the disk, including but not limited to metal, metal alloy, plastic, or glass. Additionally, a disk may be supported vertically upright in a woven basket or be clamped into a vertical position with one or more clamps on the outer edge. The support may be constructed of any material with the strength to hold the disk, such as metal, metal alloy, plastic or glass. However, the disk is supported, the disk will be lowered into a container holding a bath of the fluorolubricant/solvent (i.e., the composition provided herein) combination. The bath may be held at room temperature or be heated or cooled to temperatures ranging from about 0° C. to about 50° C.

Alternatively, the disk may be supported as described above and the bath may be raised to immerse the disk. In either case, the disk may then be removed from the bath (either by lowering the bath or by raising the disk). Excess fluorolubricant/solvent combination can be drained into the bath.

Either of the processes for contacting the fluorolubricant/solvent combination with the disk surface of either lowering the disk into a bath or raising a bath to immerse the disk are commonly referred to as dip coating. Other processes for contacting the disk with the fluorolubricant/solvent combination may be used in processes described herein, including, but not limited to, spraying or spin coating.

When the disk is removed from the bath, the disk will have a coating of fluorolubricant and some residual solvent (i.e., the composition provided herein) on its surface. The residual solvent may be evaporated. Evaporation is usually performed at room temperature. However, other temperatures both above and below room temperature may be used as well for the evaporation step. Temperatures ranging from about 0° C. to about 100° C. may be used for evaporation.

The surface, or the disk if the surface is a disk, after completion of the coating process, will be left with a substantially uniform or uniform coating of fluorolubricant that is substantially free of solvent. The fluorolubricant may be applied to a thickness of less than about 300 nm, and alternately to a thickness of about 100 to about 300 nm.

A uniform fluorolubricant coating is desired for proper functioning of a disk and so areas of varying fluorolubricant thickness are undesirable on the surface of the disk. As more and more information is being stored on the same size disk, the read/write head must get closer and closer to the disk in order to function properly. If irregularities due to variation in coating thickness are present on the surface of the disk, the probability of contact of the head with these areas on the disk is much greater. While there is a desire to have enough fluorolubricant on the disk to flow into areas where it may be removed by head contact or other means, coating that is too thick may cause "smear," a problem associated with the read/write head picking up excess fluorolubricant.

One specific coating thickness irregularity observed in the industry is that known as the "rabbit ears" effect. These irregularities are visually detected on the surface of the disk after deposition of the fluorolubricant using the existing solvent systems. When the disk is contacted with the solution of fluorolubricant in solvent and then removed from the solution, any points where the solution may accumulate and not drain readily develop drops of solution that do not readily drain off. One such point of drop formation is the contact point (or points) with the mandrel or other support device with the disk. When a V-shaped mandrel is used, there are two contact points at which the mandrel contacts the inside edge of the disk. When solution of fluorolubricant forms drops in these locations that do not drain off when removed from the bath, an area of greater thickness of fluorolubricant is created when the solvent evaporates. The two points of contact with the disk produces what is known as a "rabbit ears" effect, because the areas of greater fluorolubricant thickness produce a pattern resembling rabbit ears visually detectable on the disk surface.

When dip coating is used for depositing fluorolubricant on the surface, the pulling-up speed (speed at which the disk is removed from the bath), and the density of the fluorolubricant and the surface tension are relevant for determining the resulting film thickness of the fluorolubricant. Awareness of these parameters for obtaining the desired film thickness is required. Details on how these parameters effect coatings are given in, "Dip-Coating of Ultra-Thin Liquid Lubricant and its Control for Thin-Film Magnetic Hard Disks" in IEEE Transactions on Magnetics, vol. 31, no. 6, November 1995, the disclosure of which is incorporated herein by reference in its entirety.

EXAMPLES

The invention will be described in greater detail by way of specific examples. The following examples are offered for illustrative purposes, and are not intended to limit the invention in any manner. Those of skill in the art will readily recognize a variety of non-critical parameters which can be changed or modified to yield essentially the same results.

Example 1. Vapor-Liquid Equilibrium Analysis and Distillation Analysis

Vapor-Liquid Equilibrium Analysis

The PTx method is a known method for experimentally measuring vapor-liquid phase equilibrium (VLE) data of a mixture. The measurements can be made either isothermally or isobarically. The isothermal method requires measurement of the total pressure of mixtures of known composition at constant temperature. In this method, the total absolute pressure in a cell of known volume is measured at a constant temperature for various known compositions of the two compounds. The isobaric method requires measurement of the temperature of mixtures of known composition at constant pressure. In this method, the temperature in a cell of known volume is measured at a constant pressure for various known compositions of the two compounds. Use of the PTx Method is described in detail in "Phase Equilibrium in Process Design", Wiley-Interscience Publisher, 1970, written by Harold R. Null, on pages 124 to 126, the disclosure of which is incorporated herein by reference in its entirety.

The measured data points can be converted into equilibrium vapor and liquid compositions in the PTx cell by using an activity coefficient equation model, such as the Non-Random, Two-Liquid (NRTL) equation, to represent liquid phase nonidealities. Use of an activity coefficient equation, such as the NRTL equation is described in detail in "The Properties of Gases and Liquids," 4th edition, published by McGraw Hill, written by Reid, Prausnitz and Poling, on pages 241 to 387, and in "Phase Equilibria in Chemical Engineering," published by Butterworth Publishers, 1985, written by Stanley M. Walas, pages 165 to 244, the disclosure of which is incorporated herein by reference in its entirety. Without wishing to be bound by any theory or explanation, it is believed that the NRTL equation, together with the PTx cell data, sufficiently predicts the vapor-liquid phase equilibrium behavior of the various mixture compositions of the present invention and as well as the behavior of these mixtures in multi-stage separation equipment such as distillation columns.

Distillation Analysis

Mixtures were prepared and distilled in a 25-plate distillation column at a pressure of 760 mm Hg per standard ASTM method D 1078. Head and flask temperatures were monitored directly to 1° C. Distillate samples were taken throughout the distillation for determination of composition by gas chromatography.

Azeotrope Compositions

Table 1 shows the azeotrope range and azeotrope point determined for various binary compositions of perfluoroheptene by distillation at atmospheric pressure (approximately 101 kPa). The perfluoroheptene used in each of the experiments was a mixture of 90 weight percent perfluorohept-3-ene and 10 weight percent perfluorohept-2-ene. PFH=perfluoroheptene; CP=cyclopentane; iPrOAc=isopropylacetate; MeAc=methyl acetate; TBAC=tert-butyl acetate; OS-10=hexamethyldisiloxane.

TABLE 1

| Composition | Boiling Point (° C.) | Azeotrope Range (wt %) | Azeotrope Point (wt %) |
| --- | --- | --- | --- |
| PFH & Methyl acetate | 47.7 | 0% to 60% PFH | 70% MeAc/ 30% PFH |
| PFH & Acetone | 44.5 | 0% to 30% PFH | 20% PFH/ 80% Acetone |
| PFH & tert-butyl acetate (TBAC) | 69 | 6% to 13% TBAC | 10% TBAC/ 90% PFH |
| PFH & Isopropyl acetate (iPrOAc) | 65 | 10% to 30% iPrOAc | 85% PFH/ 15% isopropyl acetate |
| PFH & heptane | 66.3 | 5% to 15% heptane | 90% PFH/ 10% heptane |
| PFH & iso-octane | 67.1 | 85%-99.9% PFH 0.1% to 15% iso-octane | 91.2% PFH/ 8.8% iso-octane |
| PFH & Hexane | 55.3 | 60% to 80% PFH 20% to 40% n-hexane | 74.7% PFH/ 25.3% Hexane |
| PFH & hexamethyldisiloxane (OS-10) | 66.7 | 0 to 10% OS-10 | 91% PFH/ 9% OS-10 |
| PFH & Cyclopentane (CP) | 41.6 | 0 to 50% CP | 63 to 60% PFH/ 37 to 40% CP |

Example 2. Flammability and Flash Point Testing

Flash point testing was performed using a mixture of perfluoroheptene (PFH) and tert-butyl acetate (TBAC). The flash point was determined using ASTM D56-05(2010), the standard test method for flash point by Tag closed Cup Tester. As demonstrated in Table 2, the boiling point in the tested range was constant and was consistent with azeotrope-like behavior. Mixtures denoted as "NF" were determined to be non-flammable.

TABLE 2

| PFH (wt %) | TBAC (wt %) | Boiling Point (° C.) | Flash Point (° C.) |
|---|---|---|---|
| 94 | 6 | 69.0 | NF |
| 92 | 8 | 69.0 | NF |
| 90 | 10 | 69.0 | NF |
| 81 | 11 | 69.0 | NF |
| 87 | 13 | 69.0 | NF |

Example 3. Metal Cleaning Analysis

Perfluoroheptene (PFH) was shown to be effective in removing a variety of machining oils used in metal fabrication process. Example of ultrasonic cleaning of oily/greasy metal (carbon steel) coupons soaked in PFH is shown below in Table 3.

TABLE 3

| Oil Type | % oil removed |
|---|---|
| Mineral Oil | 94.1 |
| Royco Hydraulic fluid | 98.7 |
| Mag Oil | 100 |
| Honing Oil | 94.4 |
| Vac Oil | 94.9 |

Example 4. Carrier Fluid Analysis

Perfluoroheptene (PFH) was determined to be an excellent carrier fluid for hexamethyldisiloxane, as shown in Table 4. Blends of PFH and hexamethyldisiloxe would be used, for example, for silicon deposition/removal on medical devices including, but not limited to, surgical needles & tubing, artificial skin & prosthetics, and contact lenses. Blends of PFH and hexamethyldisiloxane was also shown to be useful as carrier fluids for formulating silicone adhesives, sealant, and coatings. PFH may also be useful as a cosmetic carrier fluid for deposition of silicone on skin and hair for improved feel benefit. As shown below in Table 4, PFH was shown to be as a non-flammable carrier fluid for Krytox lubricants and can be used to deliver high performance lubrication and anti-corrosion coatings on bearing, valves & seals for improved reliability. PFH also demonstrated good solubility for Zonyl fluoroadditives used in water proof coatings, oil-repellency surfaces and anti-contamination coating. PFH can also be useful as a carrier fluid for fluorosurfactants used for water displacement drying of reflective and refractive surfaces such as optical and medical devices.

TABLE 4

| Additive | PFH | Solubility in PFH |
|---|---|---|
| Hexamethyldisiloxane | Miscible | 100% |
| Krytox Lubricants | Miscible | >25% |
| Zonyl Surfactant | Miscible | >10% |

Example 5. Cleaning Effectiveness Factor (CEF) Analysis of Perfluoroheptene/n-Heptane Blend The title blend (90 wt % perfluoroheptene and 10 wt % n-heptane) was prepared and decanted into a 1000 mL beaker with a condensing coil and heated to the boiling point (65° C.) using a hot plate. Three pre-cleaned 304 stainless steel coupons were weighed on an analytical balance (initial weight). A small thin film of Starrett M1 all-purpose lubricant was applied to one surface of each coupon and excess was wiped off with a clean wipe. Each coupon was then reweighed to determine the soiled weight and then placed in the vapor phase of the boiling solvent blend for ten minutes. Coupons were then removed and allowed to dry and off-gas for ten minutes before reweighing (post-cleaning weight) to determine the cleaning effectiveness factor of the solvent blend. The cleaning effectiveness factor (CEF) was determined by Equation 1;

$$CEF = (\text{soiled weight} - \text{post cleaning weight}) / (\text{soiled weight} - \text{initial weight})$$ Equation 1.

TABLE 5

| Coupon ID | Initial Weight (g) | Soiled Weight (g) | Post-Cleaning Weight (g) | CEF (%) |
|---|---|---|---|---|
| 5A | 58.0224 | 58.0618 | 58.0234 | 97.5 |
| 5B | 58.3732 | 58.3809 | 58.3737 | 93.5 |
| 5C | 58.562 | 58.5862 | 58.564 | 91.7 |

Example 6. Cleaning Effectiveness Factor (CEF) Analysis of Perfluoroheptene/Acetone Blend The title blend (20 wt % perfluoroheptene and 80 wt % acetone) was prepared and decanted into a 1000 mL beaker with a condensing coil and heated to the boiling point (47.1° C.) using a hot plate. Three pre-cleaned 304 stainless steel coupons were weighed on an analytical balance (initial weight). A small thin film of Krylon Industrial acrylic lacquer paint was sprayed onto each coupon and left to cure overnight. Each coupon was then reweighed to determine the soiled weight and then placed in the vapor phase of the boiling solvent blend for ten minutes. Coupons were then removed and allowed to dry and off-gas for ten minutes before reweighing (post-cleaning weight) to determine the cleaning effectiveness factor of the solvent blend. The cleaning effectiveness factor (CEF) was determined by Equation 1 as described in Example 5.

TABLE 6

| Coupon ID | Initial Weight (g) | Soiled Weight (g) | Post-Cleaning Weight (g) | CEF (%) |
|---|---|---|---|---|
| 6A | 58.6604 | 58.7417 | 58.6617 | 98.4 |
| 6B | 57.8317 | 57.903 | 57.8318 | 99.9 |
| 6C | 58.1889 | 58.2671 | 58.1892 | 99.6 |

Example 7. Cleaning Effectiveness Factor (CEF) Analysis of Perfluoroheptene/Methyl Acetate Blend The title blend (30 wt % perfluoroheptene and 70 wt % methyl acetate) was prepared and decanted into a 1000 mL beaker with a condensing coil and heated to the boiling point (45.4° C.) using a hot plate. Three pre-cleaned 304 stainless steel coupons were weighed on an analytical balance (initial weight). A small thin film of Emkarate RL 32-3MAF POE lubricant was applied on the surface of each coupon. Excess oil was then wiped off with a clean wipe. Each coupon was then reweighed to determine the soiled weight and then placed in the vapor phase of the boiling solvent blend for ten minutes. Coupons were then removed and allowed to dry and off-gas for ten minutes before reweighing (post-cleaning weight) to determine the cleaning effectiveness factor of the solvent blend. The cleaning effectiveness factor (CEF) was determined using Equation 1 as described in Example 5.

TABLE 7

| Coupon ID | Initial Weight (g) | Soiled Weight (g) | Post-Cleaning Weight (g) | CEF (%) |
|---|---|---|---|---|
| 7A | 58.6319 | 58.6636 | 58.6322 | 99.1 |
| 7B | 58.0019 | 58.0527 | 58.0017 | 100.4 |
| 7C | 58.0228 | 58.0816 | 58.0221 | 101.2 |

Example 8. Cleaning Effectiveness Factor (CEF) Analysis of Perfluoroheptene/Isopropyl Acetate Blend The title blend (85 wt % perfluoroheptene and 15 wt % isopropyl acetate) was prepared and decanted into a 1000 mL beaker with a condensing coil and heated to the boiling point (63.2° C.) using a hot plate. Three pre-cleaned 304 stainless steel coupons were weighed on an analytical balance (initial weight). A small thin film of Copeland Ultra 22 POE lubricant was applied on the surface of each coupon. Excess oil was then wiped off with a clean wipe. Each coupon was then reweighed to determine the soiled weight and then placed in the vapor phase of the boiling solvent blend for ten minutes. Coupons were then removed and allowed to dry and off-gas for ten minutes before reweighing (post-cleaning weight) to determine the cleaning effectiveness factor of the solvent blend. The cleaning effectiveness factor (CEF) was determined using Equation 1 as described in Example 5.

TABLE 8

| Coupon ID | Initial Weight (g) | Soiled Weight (g) | Post-Cleaning Weight (g) | CEF (%) |
|---|---|---|---|---|
| 8A | 58.0218 | 58.0593 | 58.0221 | 99.2 |
| 8B | 58.6322 | 58.6799 | 58.6321 | 100.2 |
| 8C | 58.0021 | 58.0476 | 58.002 | 100.2 |

Example 9. Cleaning Effectiveness Factor (CEF) Analysis of Perfluoroheptene/Cyclopentane Blend The title blend (62 wt % perfluoroheptene and 38 wt % cyclopentane) was prepared and decanted into a 1000 mL beaker with a condensing coil and heated to the boiling point (41° C.) using a hot plate. Three pre-cleaned 304 stainless steel coupons were weighed on an analytical balance (initial weight). A small thin film of Starrett tool & instrument oil (cat no. 1620) was applied on the surface of each coupon. Excess oil was then wiped off with a clean wipe. Each coupon was then reweighed to determine the soiled weight and then placed in the vapor phase of the boiling solvent blend for ten minutes. Coupons were then removed and allowed to dry and off-gas for ten minutes before reweighing (post-cleaning weight) to determine the cleaning effectiveness factor of the solvent blend. The cleaning effectiveness factor (CEF) was determined using Equation 1 as described in Example 5.

TABLE 9

| Coupon ID | Initial Weight (g) | Soiled Weight (g) | Post-Cleaning Weight (g) | CEF (%) |
|---|---|---|---|---|
| 9A | 58.6604 | 58.7099 | 58.6605 | 99.8 |
| 9B | 57.8317 | 57.882 | 57.8319 | 99.6 |
| 9C | 58.2677 | 58.2904 | 58.2677 | 100.0 |

Example 10. Cleaning Effectiveness Factor (CEF) Analysis of Perfluoroheptene/Hexane Blend The title blend (75 wt % perfluoroheptene and 25 wt % hexane) was prepared and decanted into a 1000 mL beaker with a condensing coil and heated to the boiling point (54.7° C.) using a hot plate. Three pre-cleaned 304 stainless steel coupons were weighed on an analytical balance (initial weight). A small thin film of RoyCo 782 Hydraulic Fluid was applied on the surface of each coupon. Excess oil was then wiped off with a clean wipe. Each coupon was then reweighed to determine the soiled weight and then placed in the vapor phase of the boiling solvent blend for ten minutes. Coupons were then removed and allowed to dry and off-gas for ten minutes before reweighing (post-cleaning weight) to determine the cleaning effectiveness factor of the solvent blend. The cleaning effectiveness factor (CEF) was determined using Equation 1 as described in Example 5.

TABLE 10

| Coupon ID | Initial Weight (g) | Soiled Weight (g) | Post-Cleaning Weight (g) | CEF (%) |
|---|---|---|---|---|
| 10A | 58.6325 | 58.683 | 58.6326 | 99.8 |
| 10B | 58.1889 | 58.233 | 58.1891 | 99.5 |
| 10C | 58.2674 | 58.3123 | 58.2675 | 99.8 |

Example 11. Cleaning Effectiveness Factor (CEF) Analysis of Perfluoroheptene/iso-Octane Blend The title blend (91 wt % perfluoroheptene and 9 wt % iso-octane) was prepared and decanted into a 1000 mL beaker with a condensing coil and heated to the boiling point (66° C.) using a hot plate. Three pre-cleaned 304 stainless steel coupons were weighed on an analytical balance (initial weight). A small thin film of WD-40 oil was applied on the surface of each coupon. Excess oil was then wiped off with a clean wipe. Each coupon was then reweighed to determine the soiled weight and then placed in the vapor phase of the boiling solvent blend for ten minutes. Coupons were then removed and allowed to dry and off-gas for ten minutes before reweighing (post-cleaning weight) to determine the cleaning effectiveness factor of the solvent blend. The cleaning effectiveness factor (CEF) was determined using Equation 1 as described in Example 5.

TABLE 11

| Coupon ID | Initial Weight (g) | Soiled Weight (g) | Post-Cleaning Weight (g) | CEF (%) |
|---|---|---|---|---|
| 11A | 58.023 | 58.0622 | 58.0236 | 98.5 |
| 11B | 58.0019 | 58.06 | 58.002 | 99.8 |
| 11C | 58.6601 | 58.7086 | 58.6614 | 97.3 |

Example 12. Cleaning Effectiveness Factor (CEF) Analysis of Perfluoroheptene/tert-Butyl Acetate Blend The title blend (90 wt % perfluoroheptene and 10 wt % tert-butyl acetate) was prepared and decanted into a 1000 mL beaker with a condensing coil and heated to the boiling point (66.6° C.) using a hot plate. Three pre-cleaned 304 stainless steel coupons were weighed on an analytical balance (initial weight). A small thin film of Emkarate RL170H POE lubricant was applied on the surface of each coupon. Excess oil was then wiped off with a clean wipe. Each coupon was then reweighed to determine the soiled weight and then placed in the vapor phase of the boiling solvent blend for ten minutes. Coupons were then removed and allowed to dry and off-gas for ten minutes before reweighing (post-cleaning weight) to determine the cleaning effectiveness factor of the solvent blend. The cleaning effectiveness factor (CEF) was determined using Equation 1 as described in Example 5.

TABLE 12

| Coupon ID | Initial Weight (g) | Soiled Weight (g) | Post-Cleaning Weight (g) | CEF (%) |
| --- | --- | --- | --- | --- |
| 12A | 58.0004 | 58.0353 | 58.0006 | 99.4 |
| 12B | 58.0228 | 58.0639 | 58.023 | 99.5 |
| 12C | 58.6322 | 58.7074 | 58.6322 | 100.0 |

OTHER EMBODIMENTS

1. In some embodiments, the present application provides a composition, comprising:
    i) perfluoroheptene; and
    ii) a compound selected from methyl acetate, acetone, tert-butyl acetate, isopropyl acetate, n-heptane, iso-octane, n-hexane, hexamethyldisiloxane, and cyclopentane;
    wherein the methyl acetate, acetone, tert-butyl acetate, isopropyl acetate, n-heptane, iso-octane, n-hexane, hexamethyldisiloxane, or cyclopentane is present in the composition in an amount effective to form an azeotrope composition or azeotrope-like composition with the perfluoroheptene.
2. The composition of embodiment 1, wherein the perfluoroheptene comprises about 90 weight percent perfluorohept-3-ene and about 10 weight percent perfluorohept-2-ene.
3. The composition of embodiment 1 or 2, wherein the composition comprises perfluoroheptene and methyl acetate, wherein the methyl acetate is present in the composition in an amount effective to form an azeotrope composition or azeotrope-like composition with the perfluoroheptene.
4. The composition of any one of embodiments 1 to 3, wherein the composition comprises about 0.1 to about 60 weight percent perfluoroheptene.
5. The composition of any one of embodiments 1 to 4, wherein the composition comprises about 99.9 to about 40 weight percent methyl acetate.
6. The composition of any one of embodiments 1 to 5, wherein the composition consists essentially of perfluoroheptene and methyl acetate.
7. The composition of any one of embodiments 1 to 3 and 5, wherein the composition consists essentially of from about 0.1 to about 60 weight percent perfluoroheptene and from about 99.9 to about 40 weight percent methyl acetate.
8. The composition of any one of embodiments 1 to 3 and 5, wherein the composition consists essentially of about 30 weight percent perfluoroheptene and about 70 weight percent methyl acetate.
9. The composition of any one of embodiments 1 to 8, wherein the composition is an azeotrope composition.
10. The composition of any one of embodiments 1 to 9, wherein the composition has a boiling point of about 47° C. to about 48° C. at a pressure of about 101 kPa.
11. The composition of embodiment 1 or 2, wherein the composition comprises perfluoroheptene and acetone, wherein the acetone is present in the composition in an amount effective to form an azeotrope composition or azeotrope-like composition with the perfluoroheptene.
12. The composition of any one of embodiments 1, 2, and 11, wherein the composition comprises about 0.1 to about 30 weight percent perfluoroheptene.
13. The composition of any one of embodiments 1, 2, 11, and 12, wherein the composition comprises about 99.9 to about 70 weight percent acetone.
14. The composition of any one of embodiments 1, 2 and 11, wherein the composition consists essentially of perfluoroheptene and acetone.
15. The composition of any one of embodiments 1, 2, 11, and 14 wherein the composition consists essentially of from about 0.1 to about 30 weight percent perfluoroheptene and from about 99.9 to about 60 weight percent acetone.
16. The composition of any one of embodiments 1, 2, 11, and 14, wherein the composition consists essentially of about 30 weight percent perfluoroheptene and about 70 weight percent methyl acetate.
17. The composition of any one of embodiments 1, 2, and 11 to 16, wherein the composition is an azeotrope composition.
18. The composition of any one of embodiments 1, 2, and 11 to 17, wherein the composition has a boiling point of about 44° C. to about 45° C. at a pressure of about 101 kPa.
19. The composition of embodiment 1 or 2, wherein the composition comprises perfluoroheptene and tert-butyl acetate, wherein the tert-butyl acetate is present in the composition in an amount effective to form an azeotrope composition or azeotrope-like composition with the perfluoroheptene.
20. The composition of any one of embodiments 1, 2, and 19, wherein the composition comprises about 87 to about 94 weight percent perfluoroheptene.
21. The composition of any one of embodiments 1, 2, 19, and 20, wherein the composition comprises about 6 to about 13 weight percent tert-butyl acetate.
22. The composition of any one of embodiments 1, 2, and 19, wherein the composition consists essentially of perfluoroheptene and tert-butyl acetate.
23. The composition of any one of embodiments 1, 2, 19, and 22, wherein the composition consists essentially of from about 87 to about 94 weight percent perfluoroheptene and from about 6 to about 13 weight percent tert-butyl acetate.
24. The composition of any one of embodiments 1, 2, 19, and 22, wherein the composition consists essentially of about 90 weight percent perfluoroheptene and about 10 weight percent tert-butyl acetate.

25. The composition of any one of embodiments 1, 2, and 19 to 24, wherein the composition is an azeotrope composition.
26. The composition of any one of embodiments 1, 2, and 19 to 25, wherein the composition has a boiling point of about 69° C. at a pressure of about 101 kPa.
27. The composition of embodiment 1 or 2, wherein the composition comprises perfluoroheptene and isopropyl acetate, wherein the isopropyl acetate is present in the composition in an amount effective to form an azeotrope composition or azeotrope-like composition with the perfluoroheptene.
28. The composition of any one of embodiments 1, 2, and 27, wherein the composition comprises about 70 to about 90 weight percent perfluoroheptene.
29. The composition of any one of embodiments 1, 2, 27, and 28, wherein the composition comprises about 10 to about 30 weight percent isopropyl acetate.
30. The composition of any one of embodiments 1, 2, and 27, wherein the composition consists essentially of perfluoroheptene and isopropyl acetate.
31. The composition of any one of embodiments 1, 2, 27, and 30, wherein the composition consists essentially of from about 70 to about 90 weight percent perfluoroheptene and from about 10 to about 30 weight percent isopropyl acetate.
32. The composition of any one of embodiments 1, 2, 27, and 30, wherein the composition consists essentially of about 85 weight percent perfluoroheptene and about 15 weight percent isopropyl acetate.
33. The composition of any one of embodiments 1, 2, and 27 to 32, wherein the composition is an azeotrope composition.
34. The composition of any one of embodiments 1, 2, and 27 to 33, wherein the composition has a boiling point of about 65° C. at a pressure of about 101 kPa.
35. The composition of embodiment 1 or 2, wherein the composition comprises perfluoroheptene and n-heptane, wherein the n-heptane is present in the composition in an amount effective to form an azeotrope composition or azeotrope-like composition with the perfluoroheptene.
36. The composition of any one of embodiments 1, 2, and 35, wherein the composition comprises about 85 to about 95 weight percent perfluoroheptene.
37. The composition of any one of embodiments 1, 2, 35, and 36, wherein the composition comprises about 5 to about 15 weight percent n-heptane.
38. The composition of any one of embodiments 1, 2, and 35, wherein the composition consists essentially of perfluoroheptene and n-heptane.
39. The composition of any one of embodiments 1, 2, 35, and 38, wherein the composition consists essentially of from about 85 to about 95 weight percent perfluoroheptene and from about 5 to about 15 weight percent n-heptane.
40. The composition of any one of embodiments 1, 2, 35, and 38, wherein the composition consists essentially of about 90 weight percent perfluoroheptene and about 10 weight percent n-heptane.
41. The composition of any one of embodiments 1, 2, and 35 to 40, wherein the composition is an azeotrope composition.
42. The composition of any one of embodiments 1, 2, and 35 to 41, wherein the composition has a boiling point of about 66° C. to about 67° C. at a pressure of about 101 kPa.
43. The composition of embodiment 1 or 2, wherein the composition comprises perfluoroheptene and iso-octane, wherein the iso-octane is present in the composition in an amount effective to form an azeotrope composition or azeotrope-like composition with the perfluoroheptene.
44. The composition of any one of embodiments 1, 2, and 43, wherein the composition comprises about 85 to about 99.9 weight percent perfluoroheptene.
45. The composition of any one of embodiments 1, 2, 43, and 44, wherein the composition comprises about 0.1 to about 15 weight percent iso-octane.
46. The composition of any one of embodiments 1, 2, and 43, wherein the composition consists essentially of perfluoroheptene and iso-octane.
47. The composition of any one of embodiments 1, 2, 43, and 46, wherein the composition consists essentially of from about 85 to about 99.9 weight percent perfluoroheptene and from about 0.1 to about 15 weight percent iso-octane.
48. The composition of any one of embodiments 1, 2, 43, and 46, wherein the composition consists essentially of about 91 weight percent perfluoroheptene and about 9 weight percent iso-octane.
49. The composition of any one of embodiments 1, 2, 43 to 48, wherein the composition is an azeotrope composition.
50. The composition of any one of embodiments 1, 2, and 43 to 49, wherein the composition has a boiling point of about 67° C. to about 68° C. at a pressure of about 101 kPa.
51. The composition of embodiment 1 or 2, wherein the composition comprises perfluoroheptene and n-hexane, wherein the n-hexane is present in the composition in an amount effective to form an azeotrope composition or azeotrope-like composition with the perfluoroheptene.
52. The composition of any one of embodiments 1, 2, and 51, wherein the composition comprises about 60 to about 80 weight percent perfluoroheptene.
53. The composition of any one of embodiments 1, 2, 51, and 52, wherein the composition comprises about 20 to about 40 weight percent n-hexane.
54. The composition of any one of embodiments 1, 2, and 51, wherein the composition consists essentially of perfluoroheptene and n-hexane.
55. The composition of any one of embodiments 1, 2, 51, and 54, wherein the composition consists essentially of from about 60 to about 80 weight percent perfluoroheptene and from about 20 to about 40 weight percent n-hexane.
56. The composition of any one of embodiments 1, 2, 51, and 54, wherein the composition consists essentially of about 91 weight percent perfluoroheptene and about 9 weight percent n-hexane.
57. The composition of any one of embodiments 1, 2, 51 to 56, wherein the composition is an azeotrope composition.
58. The composition of any one of embodiments 1, 2, 51 to 57, wherein the composition has a boiling point of about 55° C. to about 56° C. at a pressure of about 101 kPa.
59. The composition of embodiment 1 or 2, wherein the composition comprises perfluoroheptene and hexamethyldisiloxane, wherein the hexamethyldisiloxane is present in the composition in an amount effective to form an azeotrope composition or azeotrope-like composition with the perfluoroheptene.

60. The composition of any one of embodiments 1, 2, and 59, wherein the composition comprises about 99.9 to about 90 weight percent perfluoroheptene.

61. The composition of any one of embodiments 1, 2, 59 and 60, wherein the composition comprises about 0.1 to about 10 weight percent hexamethyldisiloxane.

62. The composition of any one of embodiments 1, 2, and 59, wherein the composition consists essentially of perfluoroheptene and hexamethyldisiloxane.

63. The composition of any one of embodiments 1, 2, 59, and 62, wherein the composition consists essentially of from about 99.9 to about 90 weight percent perfluoroheptene and from about 0.1 to about 10 weight percent hexamethyldisiloxane.

64. The composition of any one of embodiments 1, 2, 59 and 62, wherein the composition consists essentially of about 91 weight percent perfluoroheptene and about 9 weight percent hexamethyldisiloxane.

65. The composition of any one of embodiments 1, 2, and 59 to 64, wherein the composition is an azeotrope composition.

66. The composition of any one of embodiments 1, 2, and 59 to 65, wherein the composition has a boiling point of about 66° C. to about 67° C. at a pressure of about 101 kPa.

67. The composition of embodiment 1 or 2, wherein the composition comprises perfluoroheptene and cyclopentane, wherein the cyclopentane is present in the composition in an amount effective to form an azeotrope composition or azeotrope-like composition with the perfluoroheptene.

68. The composition of any one of embodiments 1, 2, and 67, wherein the composition comprises about 99.9 to about 50 weight percent perfluoroheptene.

69. The composition of any one of embodiments 1, 2, 67, and 68, wherein the composition comprises about 0.1 to about 50 weight percent cyclopentane.

70. The composition of any one of embodiments 1, 2, and 67, wherein the composition consists essentially of perfluoroheptene and cyclopentane.

71. The composition of any one of embodiments 1, 2, 67, and 70, wherein the composition consists essentially of from about 99.9 to about 50 weight percent perfluoroheptene and from about 0.1 to about 50 weight percent cyclopentane.

72. The composition of any one of embodiments 1, 2, 67, and 70, wherein the composition consists essentially of about 60 to about 63 weight percent perfluoroheptene and about 37 to about 40 weight percent cyclopentane.

73. The composition of any one of embodiments 1, 2, and 67 to 72, wherein the composition is an azeotrope composition.

74. The composition of any one of embodiments 1, 2, and 67 to 73, wherein the composition has a boiling point of about 41° C. to about 42° C. at a pressure of about 101 kPa.

75. A process for dissolving a solute, comprising contacting and mixing said solute with a sufficient quantity of the composition of any one of embodiments 1 to 75.

76. A process of cleaning a surface, comprising contacting the composition of any one of embodiments 1 to 75.

77. A process for removing at least a portion of water from the surface of a wetted substrate, comprising contacting the substrate with the composition of any one of embodiments 1 to 75, and then removing the substrate from contact with the composition.

78. The process of embodiment 77, wherein composition further comprises at least one surfactant suitable for dewatering or drying the substrate.

79. A process of depositing a fluorolubricant on a surface, comprising:
    a) combining a fluorolubricant and a solvent comprising the composition of any one of embodiments 1 to 75, to form a lubricant-solvent combination;
    b) contacting the lubricant-solvent combination with the surface; and
    c) evaporating the solvent from the surface to form a fluorolubricant coating on the surface.

80. The process of embodiment 79, wherein the surface is selected from a semiconductor material, a metal, a metal oxide, a vapor deposited carbon, and a glass.

81. The process of embodiment 79 or 80, wherein the surface is a magnetic medium.

82. The process of embodiment 81, wherein the magnetic medium is a computer disk.

83. The process of any one of embodiments 79 to 82, wherein the contacting comprises dipping or immersing the surface in a bath comprising the fluorolubricant.

84. The process of any one of embodiments 79 to 83, wherein the contacting comprises spraying or spin coating the surface with the fluorolubricant.

85. The process of any one of embodiments 79 to 84, wherein the fluorolubricant concentration in the lubricant-solvent combination is from about 0.02 weight percent to about 0.5 weight percent.

86. The process of any one of embodiments 79 to 85, wherein the evaporating is performed at a temperature which is at or above the boiling point temperature of the solvent and below the boiling point temperature of the lubricant-solvent combination.

87. The process of any one of embodiments 79 to 86, wherein the evaporating is performed at a temperature which is at or above the boiling point temperature of the composition of any one of claims 1 to 75.

88. The process of any one of embodiments 79 to 87, wherein the evaporating is performed at a temperature of from about 40° C. to about 70° C.

89. The process of any one of embodiments 79 to 88, wherein the fluorolubricant comprises a perfluoropolyether.

90. The process of any one of embodiments 79 to 89, wherein the fluorolubricant is a perfluoropolyether or a mixture of perfluoropolyethers.

It is to be understood that while the invention has been described in conjunction with the detailed description thereof, the foregoing description is intended to illustrate and not limit the scope of the invention, which is defined by the scope of the appended claims. Other aspects, advantages, and modifications are within the scope of the following claims. It should be appreciated by those persons having ordinary skill in the art(s) to which the present invention relates that any of the features described herein in respect of any particular aspect and/or embodiment of the present invention can be combined with one or more of any of the other features of any other aspects and/or embodiments of the present invention described herein, with modifications as appropriate to ensure compatibility of the combinations. Such combinations are considered to be part of the present invention contemplated by this disclosure.

What is claimed is:

1. A composition, comprising:
   i) perfluoroheptene; and
   ii) a compound selected from the group consisting of methyl acetate, tert-butyl acetate, isopropyl acetate, n-heptane, iso-octane, n-hexane, hexamethyldisiloxane, and cyclopentane;
      wherein the methyl acetate, tert-butyl acetate, isopropyl acetate, n-heptane, iso-octane, n-hexane, hexamethyldisiloxane, or cyclopentane is present in the composition in an amount effective to form an azeotrope composition or azeotrope-like composition with the perfluoroheptene.

2. The composition of claim 1, wherein the perfluoroheptene comprises about 90 weight percent perfluorohept-3-ene and about 10 weight percent perfluorohept-2-ene.

3. The composition of claim 2, wherein the composition comprises perfluoroheptene and methyl acetate, wherein the methyl acetate is present in the composition in an amount effective to form an azeotrope composition or azeotrope-like composition with the perfluoroheptene.

4. The composition of claim 3, wherein the composition consists essentially of from about 0.1 to about 60 weight percent perfluoroheptene and from about 99.9 to about 40 weight percent methyl acetate.

5. The composition of claim 2, wherein the composition comprises perfluoroheptene and tert-butyl acetate, wherein the tert-butyl acetate is present in the composition in an amount effective to form an azeotrope composition or azeotrope-like composition with the perfluoroheptene.

6. The composition of claim 5, wherein the composition consists essentially of from about 87 to about 94 weight percent perfluoroheptene and from about 6 to about 13 weight percent tert-butyl acetate.

7. The composition of claim 2, wherein the composition comprises perfluoroheptene and isopropyl acetate, wherein the isopropyl acetate is present in the composition in an amount effective to form an azeotrope composition or azeotrope-like composition with the perfluoroheptene.

8. The composition of claim 7, wherein the composition consists essentially of from about 70 to about 90 weight percent perfluoroheptene and from about 10 to about 30 weight percent isopropyl acetate.

9. The composition of claim 2, wherein the composition comprises perfluoroheptene and n-heptane, wherein the n-heptane is present in the composition in an amount effective to form an azeotrope composition or azeotrope-like composition with the perfluoroheptene.

10. The composition of claim 9, wherein the composition consists essentially of from about 85 to about 95 weight percent perfluoroheptene and from about 5 to about 15 weight percent n-heptane.

11. The composition of claim 2, wherein the composition comprises perfluoroheptene and iso-octane, wherein the iso-octane is present in the composition in an amount effective to form an azeotrope composition or azeotrope-like composition with the perfluoroheptene.

12. The composition of claim 11, wherein the composition consists essentially of from about 85 to about 99.9 weight percent perfluoroheptene and from about 0.1 to about 15 weight percent iso-octane.

13. The composition of claim 2, wherein the composition comprises perfluoroheptene and n-hexane, wherein the n-hexane is present in the composition in an amount effective to form an azeotrope composition or azeotrope-like composition with the perfluoroheptene.

14. The composition of claim 13, wherein the composition consists essentially of from about 60 to about 80 weight percent perfluoroheptene and from about 20 to about 40 weight percent n-hexane.

15. The composition of claim 2, wherein the composition comprises perfluoroheptene and hexamethyldisiloxane, wherein the hexamethyldisiloxane is present in the composition in an amount effective to form an azeotrope composition or azeotrope-like composition with the perfluoroheptene.

16. The composition of claim 15, wherein the composition consists essentially of from about 99.9 to about 90 weight percent perfluoroheptene and from about 0.1 to about 10 weight percent hexamethyldisiloxane.

17. The composition of claim 2, wherein the composition comprises perfluoroheptene and cyclopentane, wherein the cyclopentane is present in the composition in an amount effective to form an azeotrope composition or azeotrope-like composition with the perfluoroheptene.

18. The composition of claim 17, wherein the composition consists essentially of from about 99.9 to about 50 weight percent perfluoroheptene and from about 0.1 to about 50 weight percent cyclopentane.

19. A process for removing at least a portion of water from the surface of a wetted substrate, comprising contacting the substrate with the composition of claim 1, and then removing the substrate from contact with the composition.

20. A process of depositing a fluorolubricant on a surface, comprising:
   a) combining a fluorolubricant and a solvent to form a lubricant-solvent combination, wherein the solvent comprises a composition of claim 1;
   b) contacting the lubricant-solvent combination with the surface; and
   c) evaporating the solvent from the surface to form a fluorolubricant coating on the surface.

* * * * *